United States Patent
Ta et al.

(10) Patent No.: US 6,566,901 B2
(45) Date of Patent: May 20, 2003

(54) PRINTED CIRCUIT BOARD TESTING APPARATUS

(75) Inventors: Lee Chin Ta, Taoyuan (TW); Chang Ko Wei, Taoyuan (TW)

(73) Assignee: Delta Electronics, Inc. (TW)

( * ) Notice: Subject to any disclaimer, the term of this patent is extended or adjusted under 35 U.S.C. 154(b) by 85 days.

(21) Appl. No.: 09/970,373

(22) Filed: Oct. 3, 2001

(65) Prior Publication Data

US 2002/0180456 A1 Dec. 5, 2002

(30) Foreign Application Priority Data

May 31, 2001 (TW) ........................................ 90113245 A

(51) Int. Cl.[7] .............................................. G01R 31/02
(52) U.S. Cl. ........................................ 324/763; 324/557
(58) Field of Search .............................. 324/73.1, 158.1, 324/308, 317, 263, 533, 750, 755, 759, 508, 764, 763; 702/118, 108, 120; 438/14; 365/201; 335/119, 88; 269/21, 22

(56) References Cited

U.S. PATENT DOCUMENTS

| | | | |
|---|---|---|---|
| 4,227,146 A | * | 10/1980 | Hodge ........................ 324/764 |
| 4,769,596 A | * | 9/1988 | Faucett ....................... 324/73.1 |
| 5,897,334 A | * | 4/1999 | Ha et al. ..................... 438/107 |

* cited by examiner

Primary Examiner—Ernest Karlsen
Assistant Examiner—Trung Nguyen
(74) Attorney, Agent, or Firm—Alston & Bird LLP

(57) ABSTRACT

The printed circuit board testing apparatus for use to test the short circuit in an induction element is provided. The apparatus includes: a signal generating device for providing a first signal; an inducing device for performing a mutual inductance effect with the induction element and making the first signal to produce a second signal in response to the mutual inductance effect; a signal converting device for converting the second signal into a direct current signal and obtaining a peak value voltage from the direct current signal; a signal processing device for outputting a controlling signal according to the relationship between the peak value voltage and a reference voltage; and a warning device for generating a warning signal in response to the status change of the controlling signal when a relative voltage standard is not identical to a predetermined voltage standard, thereby judging whether there is any short circuit formed.

17 Claims, 3 Drawing Sheets

PRINTED CIRCUIT BOARD TESTING APPARATUS

FIELD OF THE INVENTION

The present invention is related to a printed circuit board testing apparatus, and more particularly, to a printed circuit board testing apparatus of multi-layered printed circuit board in the planar transformer structure, which is applied to test the short circuit in the annular circuit.

BACKGROUND OF THE INVENTION

In the early stage, a computer had a huge size. One computer was as huge as one room because the early computer was made by vacuum tubes, circuits, and transformers. Later, these components with huge sizes were replaced by the semiconductor and the printed circuit board (PCB). Now, thanks to the printed circuit board, the computer has a small size that can be carried with one. This product, the printed circuit board is to be used, not only in a motherboard, but also in a interface card in a computer or other household appliances. The printed circuit board has made the complex circuit and copper wire between each components through etching on a board by a meticulous and ordered scheme. The components will interact with each other as long as being plugged the components in the board.

Therefore, one printed circuit board is often a "sandwich" with several layers of circuits. For example, a planar transformer has four layers at least and presently seven layers at most. The more layers it has, the smaller space it occupies and the fewer noisy signal of circuit it has. However, due to these circuits are formed through etching directly on the printed circuit board, if the etching is not complete, the circuit of the printed circuit board might be cut off and generate a phenomenon of short circuit.

In order to control the producing quality effectively, it is necessary to test whether there is a short circuit formed in the circuit of the printed circuit board after the etching process of a printed circuit board is complete. Please refer to FIG. 1. FIG. 1 is a schematic view showing the short circuit testing of the printed circuit board 11 in a planar transformer according to the prior art. Due to the fact that the planar transformer produces a change of inductance value by the mutual inductance effect between the coil and the magnetic field, the upper surface and the lower surface of the coil 13 of the printed circuit board are clipped by two magnetic elements 121 and 122 respectively before the performing of the short circuit testing of the printed circuit board 11 in a planar transformer. The mutual inductance effect is produced by the interaction between the two magnetic elements 121 and 122 and the coil 13 of the printed circuit board 11. Then, the LCR minimeter 14 is connected to two terminal points 151 and 152 of the coil 13 to measure whether the inductance value is the predetermined inductance value. If the measured inductance value is not the predetermined value, it means that the short circuit is formed in the circuit of the printed circuit board in the planar transformer. However, the common way of testing uses one single meter and merely measures the printed circuit board in one planar transformer at a time, which does not conform to the economic benefits in the market of mass production today. Furthermore, it is necessary to clip the upper surface and the lower surface of the printed circuit board with magnetic elements in advance before the testing process. This step not only wastes the time and the energy, but also wears and tears the components and damages the printed circuit board easily when pulling the magnetic element out and plugging the magnetic element in. In that way, the cost is increased unnecessarily.

In order to overcome the foresaid drawbacks, the present invention provides a printed circuit board testing apparatus of multi-layered printed circuit board in the planar transformer structure for testing the short circuit in the printed circuit board.

SUMMARY OF THE INVENTION

It is an object of the present invention to provide a printed circuit board testing apparatus for testing whether there is a short circuit formed in the circuit of the printed circuit board.

It is another object of the present invention to provide a printed circuit board testing apparatus for being used to test the short circuit in an induction element of a printed circuit board, including: a signal generating device, an inducing device, a signal converting device, a signal processing device, and a warning device. The signal generating device is used for providing a first signal. The inducing device is electrically connected to the signal generating device for performing a mutual inductance effect with the induction element of the printed circuit board and making the first signal to produce a second signal in response to the mutual inductance effect. The signal converting device is electrically connected to the inducing device for converting the second signal into a direct current signal and obtaining a peak value voltage from the direct current signal. The signal processing device is electrically connected to the signal converting device for outputting a controlling signal according to the relationship between the peak value voltage and a reference voltage. The warning device is electrically connected to the signal processing device and driven by the controlling signal for changing the status thereof and generating a warning signal in response to the status change of the controlling signal when a relative voltage standard obtained by the signal processing device is not identical to a predetermined voltage standard due to the short circuit of the induction element of the printed circuit board, thereby judging whether there is a short circuit formed in the induction element of the printed circuit board.

In accordance with the present invention, the signal generating device is an oscillator.

Preferably, the inducing device is an inductor.

Preferably, the signal converting device is a rectifier.

Preferably, the reference voltage is provided by a power supply.

Preferably, the signal processing device includes a comparator and a voltage detecting device. The comparator is electrically connected to the signal converting device for comparing the peak value voltage and the reference voltage and outputting the relative voltage standard. The voltage detecting device is electrically connected to the comparator for detecting whether the relative voltage standard is the predetermined voltage standard and outputting the controlling signal.

Preferably, the warning device is a light-emitting diode.

Certainly, the warning device can alternatively be a buzzer.

Preferably, the induction element is a transformer disposed in the printed circuit board.

It is another object of the present invention to provide a printed circuit board testing apparatus for being used to test the short circuit in an induction element of a printed circuit board, including: a signal generating device, an inducing device, and a comparator device. The signal generating device is used for providing a first signal. The inducing device is electrically connected to the signal generating device for performing a mutual inductance effect with the induction element of the printed circuit board and making first signal to produce a second signal in response to the mutual inductance effect. The comparator device is electrically connected to the inducing device for comparing a peak value voltage and a reference voltage in response to the relationship between the peak value voltage and the reference voltage, thereby judging whether there is a short circuit formed in the induction element of the printed circuit board.

In accordance with the present invention, the signal generating device is an oscillator.

Preferably, the inducing device is an inductor.

Preferably, the reference voltage is provided by a power supply.

Preferably, the comparator device includes a signal converting device, a comparator, and a voltage judging device. The comparator device is electrically connected to the inducing device for converting the second signal into a direct current signal and providing the peak value voltage. The comparator is electrically connected to the signal converting device for comparing the peak value voltage and the reference voltage in response to the comparative value of the peak value voltage and the reference voltage, thereby outputting a relative voltage standard. The voltage judging device is electrically connected to the comparator for judging whether the relative voltage standard signal is identical to a predetermined voltage standard, thereby outputting a controlling signal.

Preferably, the signal converting device is a rectifier.

Preferably, the voltage judging device is further electrically connected to a warning device and driven by the controlling signal for changing the status thereof and generating a warning signal in response to the status change of the controlling signal when a relative voltage standard obtained by the signal processing device is not identical to a predetermined voltage standard due to the short circuit of the induction element of the printed circuit board.

Preferably, the warning device is a light-emitting diode.

The foregoing and other features and advantages of the present invention will be more clearly understood through the following descriptions with reference to the drawings, wherein:

DETAILED DESCRIPTION OF THE PREFERRED EMBODIMENT

Figure 1:
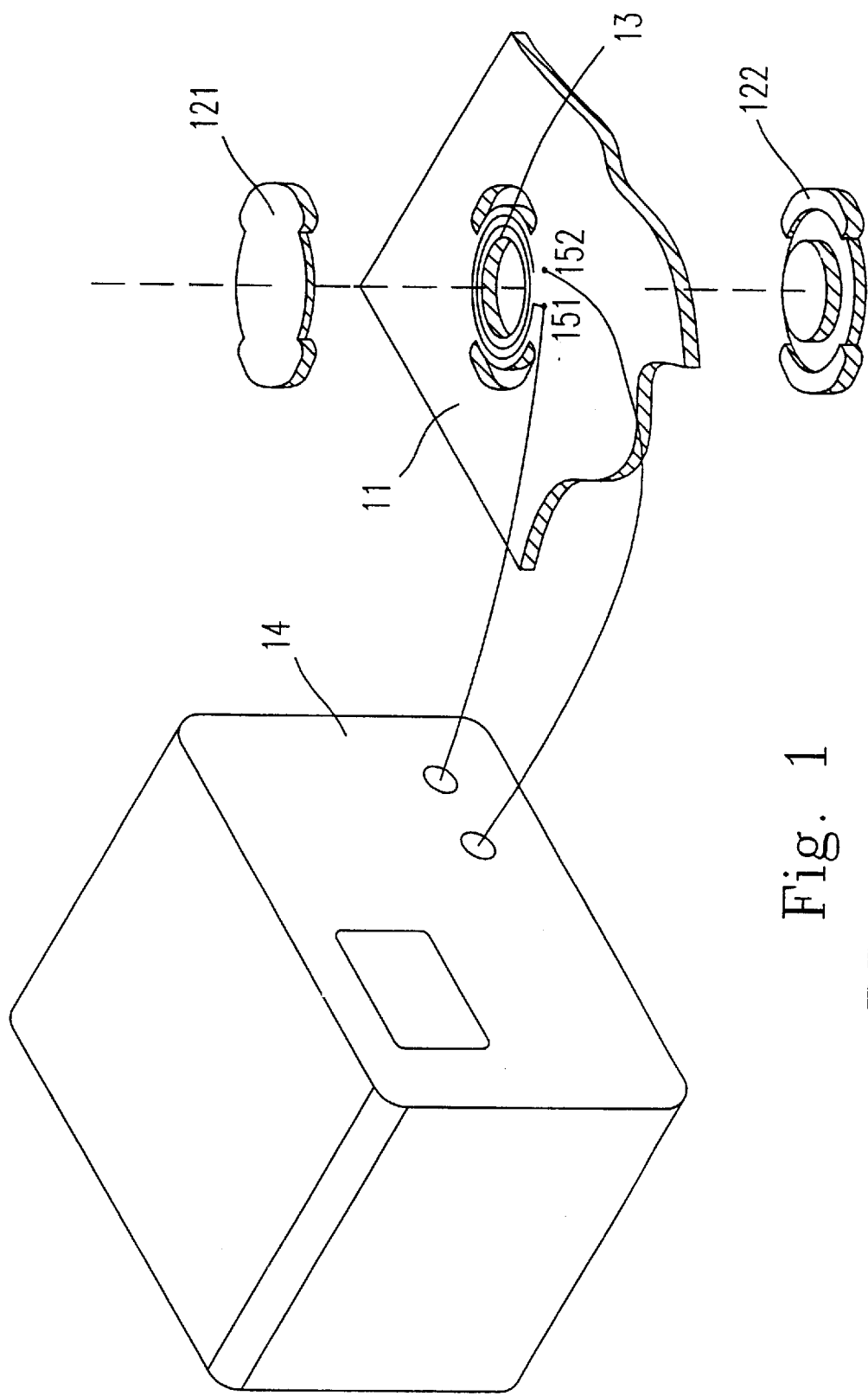
FIG. 1 is a schematic view illustrating the short circuit testing of the printed circuit board in a planar transformer according to the prior art.
Figure 2:
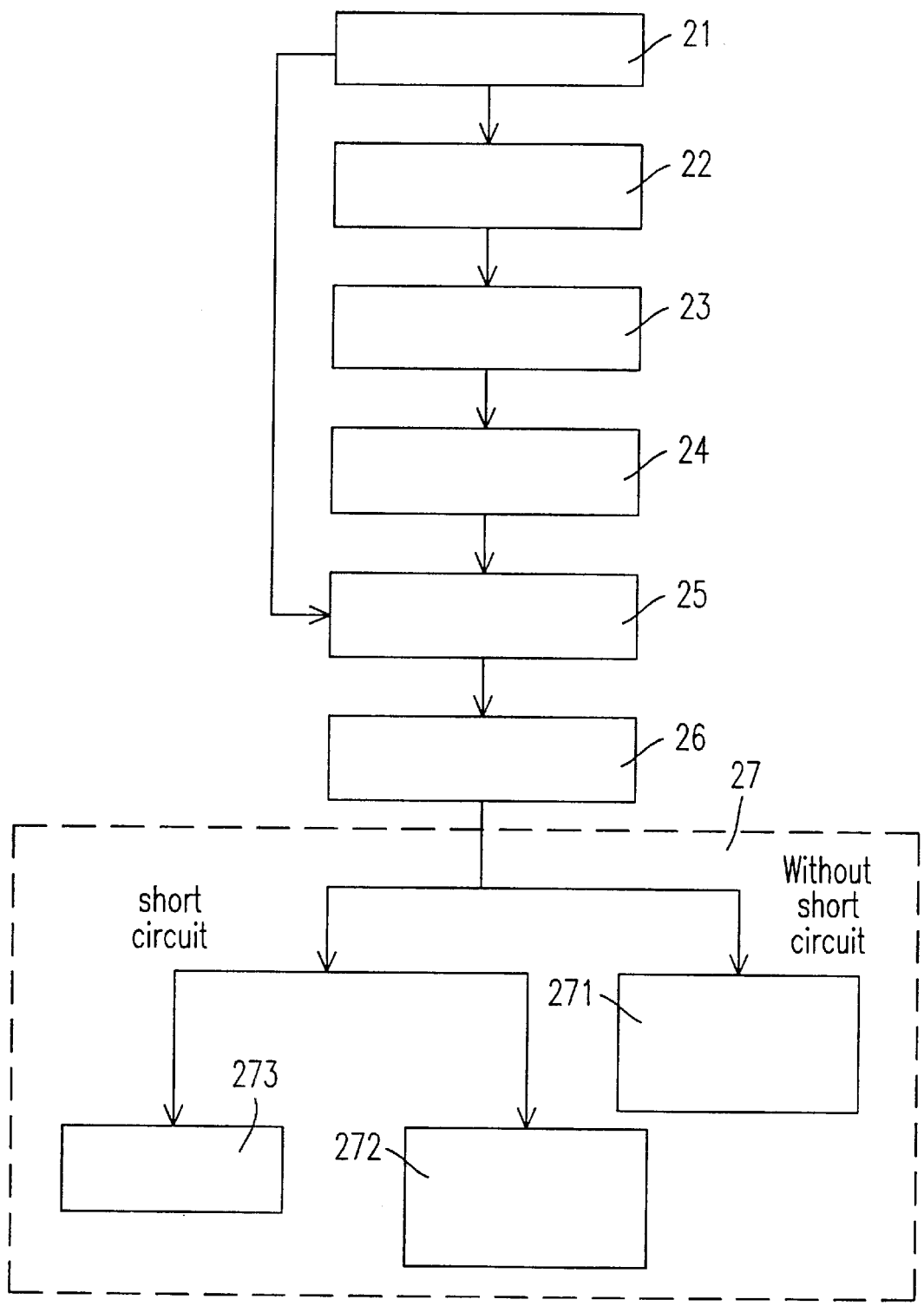
FIG. 2 is a block diagram illustrating the short circuit testing function of the printed circuit board in a planar transformer according to the preferred embodiment of the present invention.

The present invention will now be described more specifically with reference to the following embodiments. Please refer to FIG. 2 which is a block diagram illustrating the short circuit testing function of the printed circuit board in a planar transformer according to the preferred embodiment of the present invention. The printed circuit board testing apparatus for being used to test the short circuit in an induction element of a printed circuit board, which includes the inducing device 23 electrically connected between the signal generating device 22 and the signal processing device. The signal processing device includes the signal converting device 24, the comparator 25, and the voltage detecting device 26. The signal generating device 22 is used for providing a first signal to the inducing device 23. When the inducing device 23 performs a mutual inductance effect with the induction element, the first signal will produce a second signal in response to the mutual inductance effect. Then, the signal converting device 24 will convert the second signal into a direct current signal and obtain a peak value voltage from the direct current signal. The peak value voltage and a reference voltage provided from the power supply 21 will be inputted to the comparator 25 to be compared to each other. The relative voltage standard will be outputted according to the relationship between the peak value voltage and the reference voltage. Afterwards, the voltage detecting device 26 will detect whether the relative voltage standard is the predetermined voltage standard and then outputs a controlling signal. The controlling signal is used for driving a warning device 27. When the relative voltage standard is not the predetermined voltage standard caused by the short circuit formed in the induction element, the warning device 27 will generate a warning signal. The warning device 27 could be light-emitting diodes 271, 272 or a buzzer 273. The light-emitting diode 271, 272 or the buzzer 273 can also be mounted at the same time. For instance: 1. Only the light-emitting diodes 271, 272 are mounted. The light-emitting diode is set to light up to show the warning signal while the short circuit is formed, and set not to light up while the circuit is normal. 2. Only the buzzer is mounted, which will buzz a warning sound while the short circuit is formed. 3. The light-emitting diodes 271, 272, and the buzzer 273 are mounted at the same time to "test more than one printed circuit board at the same time." Generally, the situation whether the short circuit is formed is observed only by the light signal of the light-emitting diodes 271 and 272. Therefore, it is necessary to depend on people to monitor the whole process. Furthermore, the eyes are easy to get tired when looking at a specific object for a long time, which might cause a "lost" situation. By the provision of the buzzer 273, the tester can know whether the short circuit is formed according to the warning sound of the buzzer 273. Then the tester can know which printed circuit board has the short circuit formed according to the position shown by the light-emitting diodes 271 and 272. (When testing multiple printed circuit board at the same time, each printed circuit board usually corresponds to one light-emitting diode.) Hence, it not only saves time and human resource, but also increases the operation efficiency by using the light-emitting diodes 271, 272 and the buzzer 273 at the same time.

Figure 3:
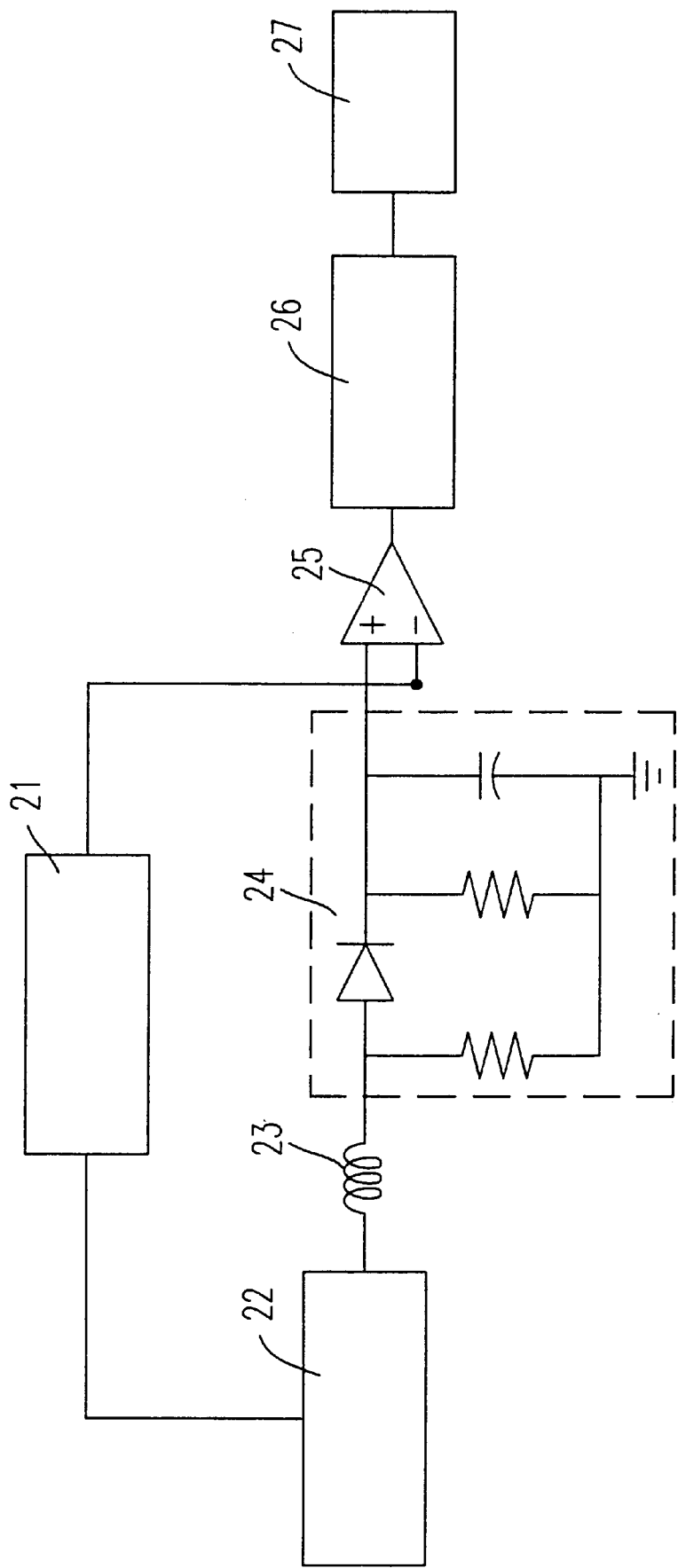
FIG. 3 is a circuit block diagram illustrating the short circuit testing function of the printed circuit board in a planar transformer according to the preferred embodiment of the present invention.

Please refer to FIG. 3 which is a circuit block diagram illustrating the short circuit testing function of the printed circuit board in a planar transformer according to the preferred embodiment of the present invention. The labeled number of the element in FIG. 3 which has the same number as in FIG. 2 means the similar element. In this embodiment, the signal converting device 24 is made by the rectifier, which is used for converting the alternating current signal into a direct current signal. The direct current outputting voltage is larger than the effective value of the alternating current inputting voltage, so the direct current signal is more stable to be tested than the alternating current signal.

Preferably, the peak value voltage obtained from the direct current signal and the reference voltage provided by the power supply 21 are inputted to the comparator 25. Wherein the reference voltage is a predetermined value which can be adjusted to the tested induction element. If the peak value voltage equals to the reference voltage ($V_{ref}$), the comparator will output a voltage standard "0." On the contrary, if the peak value voltage does not equal to the reference voltage ($V_{ref}$), the comparator will output another voltage standard "1." When the voltage detecting device 26 receives the voltage standard value transmitted from the comparator 25 and the value is 0, the voltage detecting device 26 will not respond. On the contrary, when the voltage detecting device 26 receives the voltage standard value transmitted from the comparator 25 and the value is 1, the voltage detecting device 26 will output the controlling signal to drive the warning device 27 to generate a warning signal.

In addition, in another embodiment of the present invention, the voltage detecting device 26 is set forth as described in the following. When the voltage detecting device 26 receives the voltage standard value transmitted from the comparator 25 and the value is 0, the voltage detecting device 26 will output the controlling signal to drive the warning device 27 to generate a warning signal. On the contrary, when the voltage standard value transmitted from the comparator 25 is 1, the voltage detecting device 26 will not respond.

The above described apparatus can further be connected with multiple identical circuits, which can test multiple printed circuit board at the same time and increase the efficiency. It can be accomplished by one skilled in the art, and therefore, it is not to be described in detail.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A printed circuit board testing apparatus for being used to test the short circuit in an induction element of a printed circuit board, comprising:
    a signal generating device for providing a first signal;
    an inducing device electrically connected to said signal generating device for performing a mutual inductance effect with said induction element of said printed circuit board and making said first signal to produce a second signal in response to said mutual inductance effect;
    a signal converting device electrically connected to said inducing device for converting said second signal into a direct current signal and obtaining a peak value voltage from said direct current signal,
    a signal processing device electrically connected to said signal converting device for outputting a controlling signal according to said relationship between said peak value voltage and a reference voltage; and
    a warning device electrically connected to said signal processing device and driven by said controlling signal for changing the status thereof and generating a warning signal in response to the status change of said controlling signal when a relative voltage standard obtained by said signal processing device is not identical to a predetermined voltage standard due to said short circuit of said induction element of said printed circuit board, thereby judging whether there is a short circuit formed in said induction element of said printed circuit board.

2. The printed circuit board testing apparatus according to claim 1, wherein said signal generating device is an oscillator.

3. The printed circuit board testing apparatus according to claim 1, wherein said inducing device is an inductor.

4. The printed circuit board testing apparatus according to claim 1, wherein said signal converting device is a rectifier.

5. The printed circuit board testing apparatus according to claim 1, wherein said reference voltage is provided by a power supply.

6. The printed circuit board testing apparatus according to claim 1, wherein said signal processing device comprises:
    a comparator electrically connected to said signal converting device for comparing said peak value voltage and said reference voltage and outputting said relative voltage standard; and
    a voltage detecting device electrically connected to said comparator for detecting whether said relative voltage standard is said predetermined voltage standard and outputting said controlling signal.

7. The printed circuit board testing apparatus according to claim 1, wherein said warning device is a light-emitting diode.

8. The printed circuit board testing apparatus according to claim 1, wherein said warning device can alternatively be a buzzer.

9. The printed circuit board testing apparatus according to claim 1, wherein said induction element is a transformer disposed in said printed circuit board.

10. A printed circuit board testing apparatus for being used to test said short circuit in an induction element of a printed circuit board, comprising:
    a signal generating device for providing a first signal;
    an inducing device electrically connected to said signal generating device for performing a mutual inductance effect with said induction element of said printed circuit board and making said first signal to produce a second signal in response to said mutual inductance effect; and
    a comparator device electrically connected to said inducing device for comparing a peak value voltage and a reference voltage in response to the relationship between said peak value voltage and said reference voltage, thereby judging whether there is a short circuit formed in said induction element of said printed circuit board.

11. The printed circuit board testing apparatus according to claim 10, wherein said signal generating device is an oscillator.

12. The printed circuit board testing apparatus according to claim 10, wherein said inducing device is an inductor.

13. The printed circuit board testing apparatus according to claim 10, wherein said reference voltage is provided by a power supply.

14. The printed circuit board testing apparatus according to claim 10, wherein said comparator device comprises:
    a signal converting device electrically connected to said inducing device for converting said second signal into a direct current signal and providing said peak value voltage;
    a comparator electrically connected to said signal converting device for comparing said peak value voltage and said reference voltage in response to said comparative value of said peak value voltage and said reference voltage, thereby outputting a relative voltage standard; and a voltage judging device electrically connected to said comparator for judging whether said relative voltage standard signal is identical to a predetermined voltage standard, thereby outputting a controlling signal.

15. The printed circuit board testing apparatus according to claim 14, wherein said signal converting device is a rectifier.

16. The printed circuit board testing apparatus according to claim 14, wherein said voltage judging device is further electrically connected to a warning device and driven by said controlling signal for changing the status thereof and generating a warning signal in response to the status change of said controlling signal when a relative voltage standard obtained by said signal processing device is not identical to a predetermined voltage standard due to said short circuit of said induction element of said printed circuit board.

17. The printed circuit board testing apparatus according to claim 14, wherein said warning device is a light-emitting diode.

* * * * *